/12) United States Patent
Underhill et al.

(10) Patent No.: US 10,935,682 B2
(45) Date of Patent: Mar. 2, 2021

(54) DOWNHOLE SEISMIC SENSING SYNCHRONIZATION SYSTEMS AND METHODS

(71) Applicant: Schlumberger Technology Corporation, Sugar Land, TX (US)

(72) Inventors: William Brian Underhill, Richmond, TX (US); Joel Herve Le Calvez, Houston, TX (US); Herve Denaclara, Stafford, TX (US)

(73) Assignee: SCHLUMBERGER TECHNOLOGY CORPORATION, Sugarland, TX (US)

( * ) Notice: Subject to any disclaimer, the term of this patent is extended or adjusted under 35 U.S.C. 154(b) by 0 days.

(21) Appl. No.: 15/712,546

(22) Filed: Sep. 22, 2017

(65) Prior Publication Data
US 2018/0095187 A1 Apr. 5, 2018

Related U.S. Application Data

(60) Provisional application No. 62/403,698, filed on Oct. 3, 2016.

(51) Int. Cl.
*G01V 1/40* (2006.01)
*G01V 1/00* (2006.01)
*G01V 1/30* (2006.01)
*G01V 1/26* (2006.01)
(Continued)

(52) U.S. Cl.
CPC ............... *G01V 1/40* (2013.01); *G01V 1/005* (2013.01); *G01V 1/26* (2013.01); *G01V 1/301* (2013.01); *G01V 1/42* (2013.01); *G01V 2200/12* (2013.01); *G01V 2200/14* (2013.01); *G01V 2210/1214* (2013.01); *G01V 2210/1295* (2013.01);
(Continued)

(58) Field of Classification Search
CPC . G01V 1/26; G01V 1/42; G01V 1/301; G01V 1/40; G01V 1/005; G01V 2200/12; G01V 2200/14; G01V 2210/1295; G01V 2210/1214; G01V 2210/16; G01V 2210/1429; G06F 17/5009
USPC .......................................... 367/57
See application file for complete search history.

(56) References Cited

U.S. PATENT DOCUMENTS 6,912,465 B2 * 6/2005 Collins .................... G01V 1/26
    702/11
8,605,544 B1 * 12/2013 Baig ....................... G01V 1/003
    367/14
(Continued)

Primary Examiner — Daniel L Murphy
(74) Attorney, Agent, or Firm — Eileen Pape

(57) ABSTRACT

A seismic system that includes a seismic source configured to generate a first seismic signal and a second seismic signal in a formation adjacent the seismic source. A first downhole sensing device disposed in a first borehole configured to detect the first seismic signal and the second seismic signal in the formation; and a first surface acquisition system is in communication with the first downhole sensing device. The first surface acquisition system is configured to: determine a first reference transit time based at least in part on detection of the first seismic signal by the first downhole sensing device; a first subsequent transit time based at least in part on detection of the second seismic signal by the first downhole sensing device; and
whether a synchronization variation is expected to be present based at least in part on the first reference transit time and the first subsequent transit time.

11 Claims, 4 Drawing Sheets

(51) Int. Cl.
*G01V 1/42* (2006.01)
*G06F 30/20* (2020.01)

(52) U.S. Cl.
CPC .. *G01V 2210/1429* (2013.01); *G01V 2210/16* (2013.01); *G06F 30/20* (2020.01)

(56) References Cited

U.S. PATENT DOCUMENTS

| | | |
|---|---|---|
| 2005/0285645 A1* | 12/2005 | Hall ................ H03K 23/52 327/165 |
| 2011/0010098 A1 | 1/2011 | Zhan et al. |
| 2012/0257477 A1 | 10/2012 | Aqrawi et al. |
| 2012/0320712 A1 | 12/2012 | Aqrawi et al. |
| 2013/0080102 A1* | 3/2013 | Seydoux .............. G01V 3/28 702/89 |
| 2013/0226545 A1 | 8/2013 | Bo |
| 2016/0327663 A1 | 11/2016 | Bernhardsson et al. |
| 2017/0254083 A1 | 9/2017 | Wu et al. |

* cited by examiner

DOWNHOLE SEISMIC SENSING SYNCHRONIZATION SYSTEMS AND METHODS

CROSS-REFERENCES TO RELATED APPLICATIONS

This application claims priority to U.S. Provisional Patent Application No. 62/403,698, filed on Oct. 3, 2016, which is incorporated in its entirety by reference herein.

BACKGROUND

Generally, seismic sensing devices, e.g., a receiver or sensor, can detect seismic signals, e.g., vibration, in the surrounding environment. In some instances, the seismic signals can be indicative of characteristics of the surrounding environment. Thus, seismic sensing devices can be used in various contexts, such as a downhole tool. In a downhole tool, multiple seismic sensing devices can be employed to facilitate conducting micro-seismic surveys, for example, to determine event hypocenter locations and/or moment tensor inversion solutions. Yet coordinating the operation of the multiple seismic sensing devices can be frustrated by variations in operation of these different components.

SUMMARY

A seismic system that includes a seismic source configured to generate a first seismic signal and a second seismic signal in a formation adjacent the seismic source. The seismic system can also include a first downhole sensing device disposed in a first borehole configured to detect the first seismic signal and the second seismic signal in the formation. A first surface acquisition system can be communication with the first downhole sensing device. The first surface acquisition system can be configured to: determine a first reference transit time based at least in part on detection of the first seismic signal by the first downhole sensing device; determine a first subsequent transit time based at least in part on detection of the second seismic signal by the first downhole sensing device; and determine whether a synchronization variation is expected to be present based at least in part on the first reference transit time and the first subsequent transit time.

A method of performing a seismic operation can include generating a first seismic signal and a second seismic signal in a formation adjacent the seismic source. The method can also include detecting the first seismic signal and the second seismic signal in the formation. The method also includes determining a first reference transit time based at least in part on detection of the first seismic signal, and determining a first subsequent transit time based at least in part on detection of the second seismic signal; and determining whether a synchronization variation is expected to be present based at least in part on the first reference transit time and the first subsequent transit time.

DETAILED DESCRIPTION

Certain examples are shown in the above-identified figures and described in detail below. In describing these examples, like or identical reference numbers are used to identify common or similar elements. The figures are not necessarily to scale and certain features and certain views of the figures may be shown exaggerated in scale or in schematic for clarity and/or conciseness. A seismic sensing device can receive seismic signals to facilitate determining characteristics of its surrounding environment. As such, seismic sensing devices can be used in various contexts. To help illustrate, the present disclosure presents techniques described in a downhole context or downhole environment. It should be appreciated that this is illustrative and not limiting. In other words, the techniques described in the present disclosure can be applied in other suitable contexts or environments.

Figure 1:
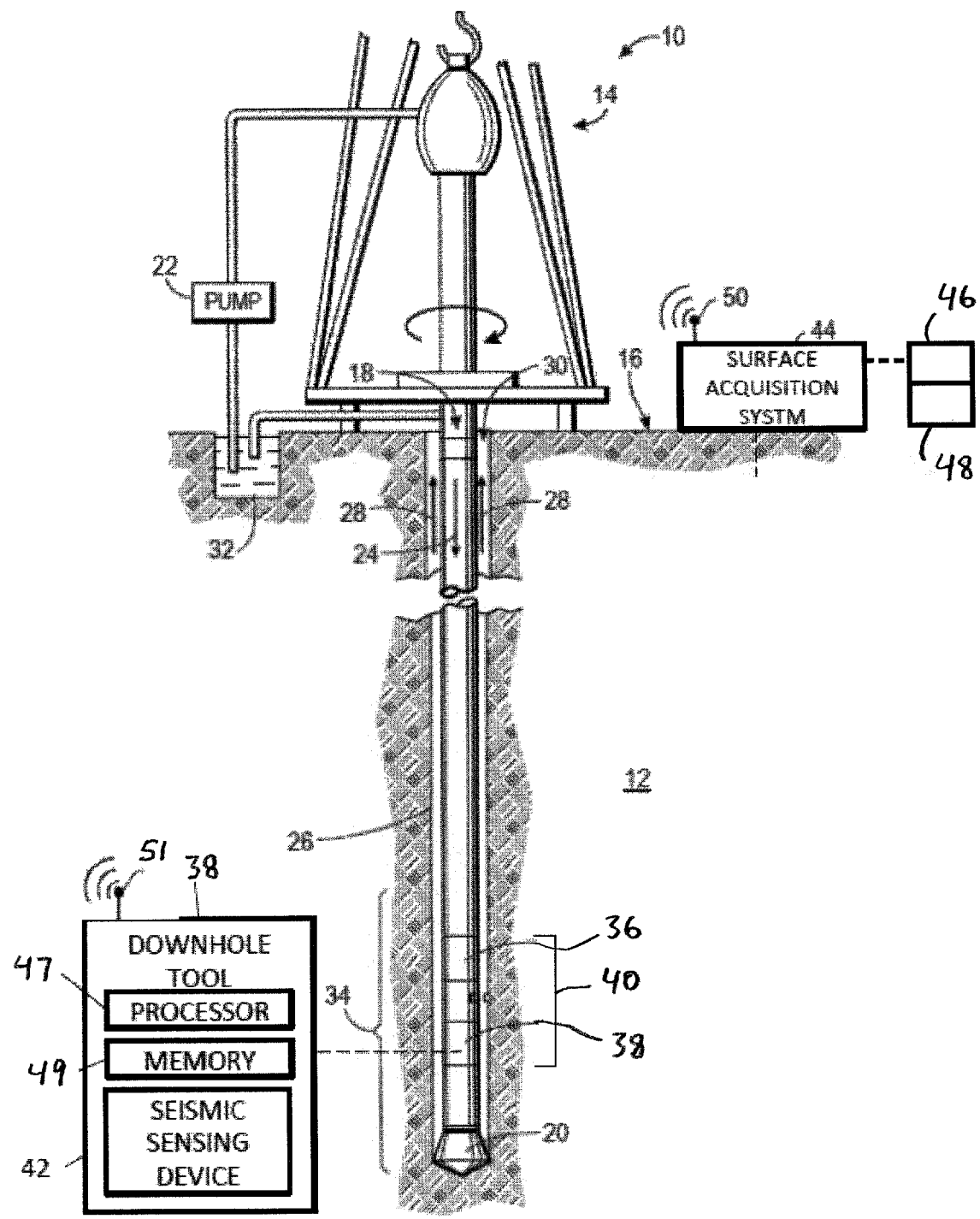
FIG. 1 depicts a schematic diagram of a drilling system including a downhole seismic sensing device, according to one or more embodiments described.
Figure 2:
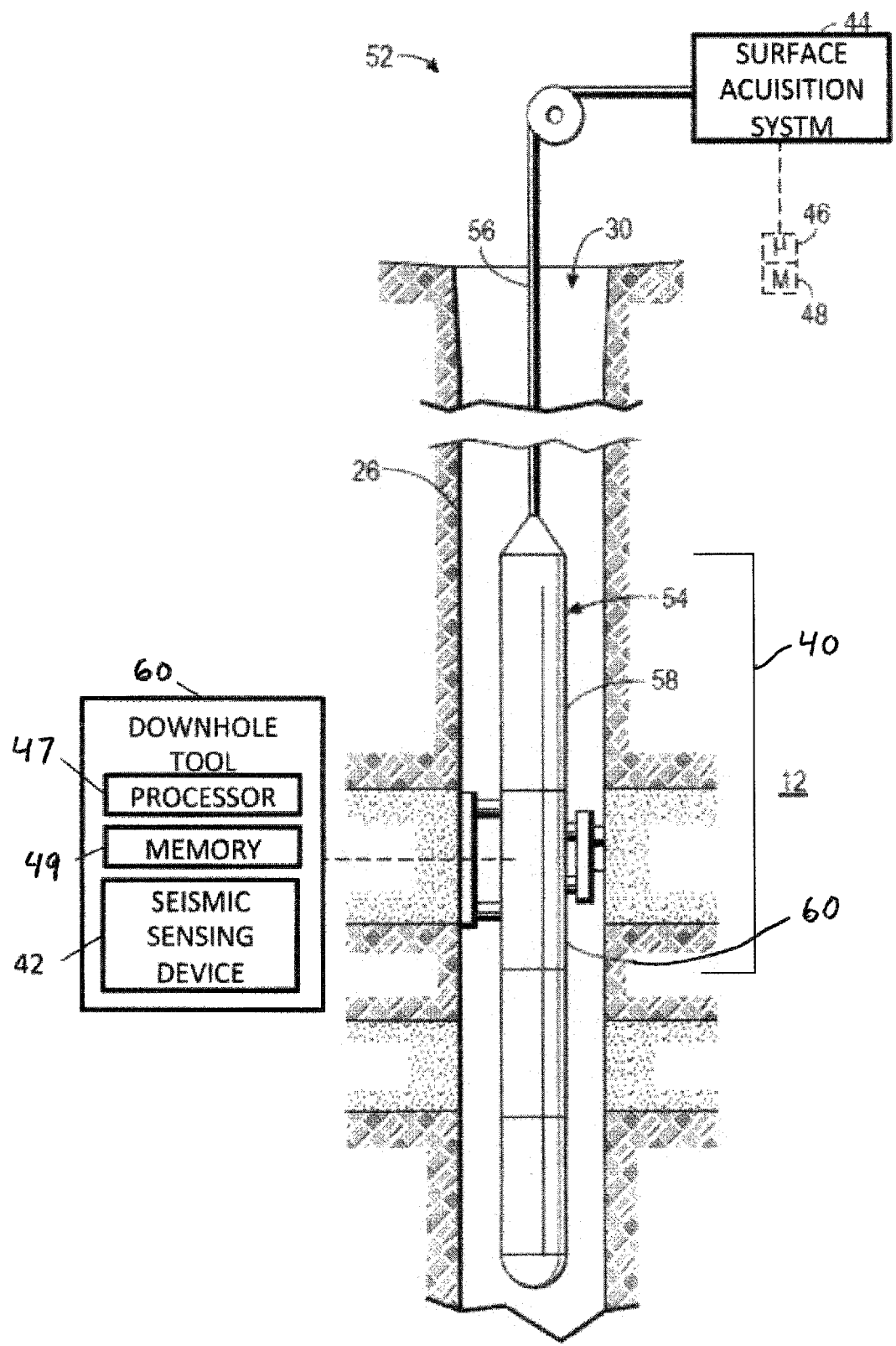
FIG. 2 depicts a schematic diagram of a wireline system including a downhole seismic sensing device, according to one or more embodiments described.

Even within the downhole context, implementation of seismic sensing devices can vary. FIGS. 1 and 2 depict examples of different systems for conveying seismic sensing devices. More particularly, FIG. 1 depicts a schematic diagram of a drilling system 10 that includes a downhole seismic sensing device 42 and FIG. 2 depicts a schematic diagram of a wireline system 52 that includes the downhole seismic sensing device 42, according to one or more embodiments.

As shown in FIG. 1, the drilling system 10 can be used to drill a well through sub-surface formations 12. In the depicted embodiment, a drilling rig 14 at the surface 16 can rotate a drill string 18, which includes a drill bit 20 at its lower end to engage the subsurface formation 12. A drilling fluid pump 22 can pump drilling fluid, commonly referred to as "mud" or "drilling mud," downward through the center of the drill string 18 in the direction of the arrow 24 to the drill bit 20, which can cool and/or lubricate the drill bit 20. At the drill bit 20, the drilling fluid can exit the drill string 18 through ports (not shown). The drilling fluid can then flow through an annulus 30 between the drill string 18 and the formation 12 in the direction of arrows 28 toward the surface 16. In this manner, the drilling fluid can carry drill cuttings away from the bottom of a borehole 26. Once at the surface 16, the returned drilling fluid can be filtered and conveyed back to a mud pit 32 for reuse.

In some examples, as depicted, a lower section of the drill string 18 can include a bottom-hole assembly 34 that can include the drill bit 20 along with one or more downhole tools 40, such as a measuring-while-drilling (MWD) tool 36 and/or a logging-while-drilling (LWD) tool 38. Generally, the downhole tools 40 can facilitate determining one or more characteristics of the surrounding formation 12. Thus, in some examples, the downhole tools 40 can include various sensing devices (e.g., sensors), such as a seismic sensing device 42 that detects seismic signals in the formation 12. The seismic sensing device 42 can include one or more acoustic receiving units which can each include one or more acoustic receivers.

In some examples, a surface acquisition system 44 can operate as a control system to control operation of the downhole tool 40. For example, the surface acquisition system 44 can instruct the seismic sensing device 42 to detect seismic signals and/or receive sensor data indicative of the detected seismic signals from the seismic sensing device 42. In some examples, the downhole tool 40 can communicate the determined information to the surface acquisition system 44 for further processing. In some examples, wireless transceivers 50/51 can be used to transmit information between the downhole tool 40 and the surface acquisition system 44. In other examples, one or more wires, optical cables, or physical connection can be used to transmit information between the downhole tool 40 and the surface acquisition system 44.

The surface acquisition system 44 can include one or more processors 46 and one or more memory 48, and/or the downhole tools 40 can include one or more processors 47 and one or more memory 49. In some examples, the processor(s) 46/47 can include one or more general purpose microprocessors, one or more application specific processors (ASICs), one or more field programmable logic arrays (FPGAs), or any combination thereof. In some examples, the memory(s) 48/49 can be a tangible, non-transitory, computer-readable medium that can store instructions executable by and data that can be processed by the processor(s) 46/47. Thus, in some examples, the memory(s) 48/49 can include random access memory (RAM), read only memory (ROM), rewritable flash memory, hard drives, optical discs, and the like.

The downhole tool 40 including the seismic sensing device 42 can be used in a wireline system 52 as shown in FIG. 2. In the depicted embodiment, the wireline system 52 can include a wireline assembly 54 suspended in the borehole 26 and coupled to a surface acquisition system 44 via a cable 56, for example, transmit or convey information gathered by the seismic sensing device 42 to the surface acquisition system 44. Similar to the bottom-hole assembly 34, the wireline assembly 54 can include various downhole tools 40. For example, the downhole tools 40 can include a telemetry tool 58 and a formation testing tool 60.

Similar to the drilling system 10, the surface acquisition system 44 can control operation of the various downhole tools 40. To facilitate controlling operation, the surface acquisition system 44 can include one or more processors 46 and one or more memory 48, and/or the formation testing tool 60 can include one or more processors 47 and one or more memory 49. In some examples, the processor(s) 46/47 can include one or more general purpose microprocessors, one or more application specific processors (ASICs), one or more field programmable logic arrays (FPGAs), or any combination thereof. In some examples, the memory(s) 48/49 can be a tangible, non-transitory, computer-readable medium that stores instructions executable by and data to be processed by the processor(s) 46/47. Thus, in some examples, the memory(s) 48/49 can include random access memory (RAM), read only memory (ROM), rewritable flash memory, hard drives, optical discs, and the like.

Although described in relation to a drilling system 10 and a wireline system 52, the seismic sensing devices 42 can also be used in other downhole systems. For example, one or more seismic sensing devices 42 can be used in a coil tubing system, a wired drill pipe system, a slick line system, or the like. Although implementation can vary, operation of seismic sensing devices 42 can be generally similar in the downhole tools 40.

Figure 3:
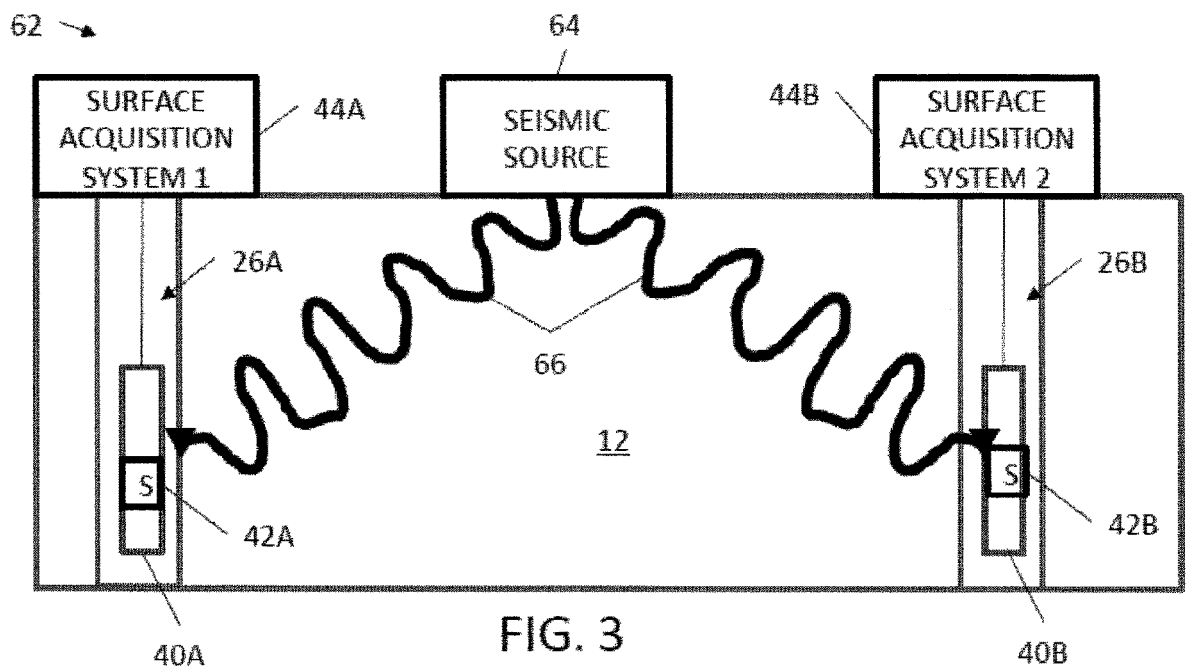
FIG. 3 depicts a schematic diagram of a seismic system including multiple downhole seismic sensing devices, according to one or more embodiments described.

In some examples, multiple seismic sensing device 42 can cooperate to facilitate determining one or more characteristics of the formation 12. FIG. 3 depicts a schematic diagram of a seismic system 62 that can include multiple downhole seismic sensing devices 42, according to one or more embodiments. For example, the seismic system 62 can include multiple seismic sensing devices 42 deployed in different boreholes 26 as shown in FIG. 3. In particular, a first downhole tool 40A can include a first seismic sensing device 42A disposed in a first borehole 26A and communicatively coupled to a first surface acquisition system 44A. In some examples, a second downhole tool 40B can include a second seismic sensing device 42B disposed in a second borehole 26B and communicatively coupled to a second surface acquisition system 44B.

In some examples, the surface acquisition systems 44A, 44B can be implemented on one or more logging (e.g., Maxis) trucks used for the deployment of a wireline-conveyed downhole tools 40A/40B having seismic sensing (e.g., VSI, OYO, or Sercel) devices 42A/42B. Furthermore, in some examples, the seismic sensing devices 42 (e.g., PS3) can be permanently deployed with the completion. In some examples, the surface acquisition systems 44 can be permanent systems.

As depicted, the seismic system 62 can include a seismic source 64. In some examples, the seismic source 64 can be any type of common vibrator and/or controlled surface source, such as an Accelerated Weight Drop or Vibrator Truck. In some examples, the seismic source 64 can be an impulsive source or a non-impulsive source.

In operation, the seismic source 64 can generate seismic signal 66. For example, the seismic signals 66 can be supplied to and radiate or otherwise traverse through the formation 12. Characteristics (e.g., properties) of the formation 12 can be determined based, at least in part, on the seismic signals 66 received by the first and second seismic sensing devices 42A, 42B. In some examples, the seismic signals 66 generated by the seismic source 64 can be any combination of amplitude and/or frequency controlled signal based at least in part on target characteristics to be determined.

Figure 4:
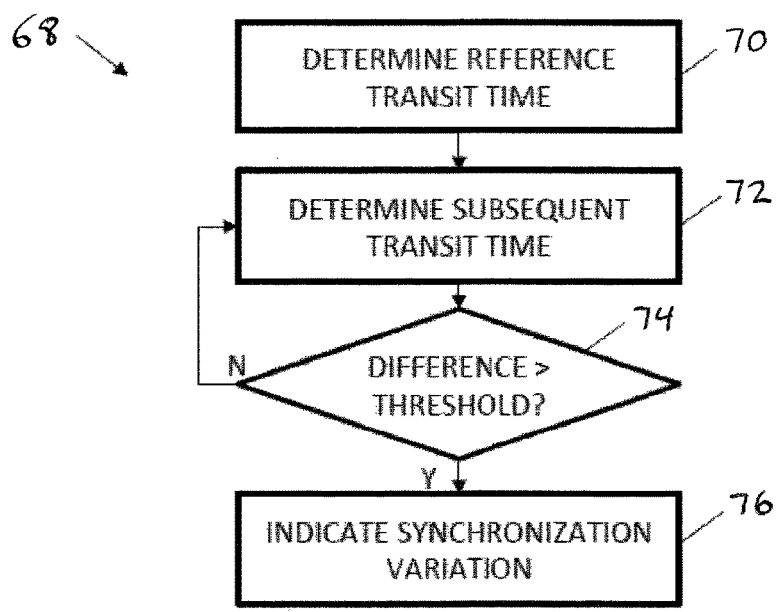
FIG. 4 depicts a flow diagram of a process for determining synchronization variation between multiple downhole seismic sensing devices, according to one or more embodiments described.

Thus, in some examples, operation of multiple seismic sensing devices 42 can be coordinated (e.g., synchronized). FIG. 4 depicts a flow diagram of a process 68 for determining synchronization variation between multiple downhole seismic sensing devices 42, according to one or more embodiments. The process 68 can include determining a reference transit time (process block 70), determining a subsequent transit time (process block 72), determining whether the reference transit time and the subsequent transit time vary by more than a threshold (decision block 74), and indicating a synchronization variation when the reference transit time and the subsequent transit time vary by more than the threshold (process block 76). In some examples, the process 68 can be implemented by executing instructions stored in a tangible, non-transitory, computer-readable medium, such as memory(s) 48/49, using one or more processors, such as processor(s) 46/47.

In some examples, the reference transit time can be determined based at least in part on transmission of an initial seismic signal 66 from the seismic source 64. In some examples, the subsequent transit time can be determined based at least in part on transmission of a subsequent seismic signal 66 from the seismic source 64. In any case, the transit time can be determined based at least in part on a known transmission time (T0) of a synchronization seismic signal and receipt of the synchronization signal by one or more seismic sensing devices 42. For example, the transit time(s) can be determined by subtracting T0 of the source from one or more arrival times of the synchronization signal.

Figure 5:
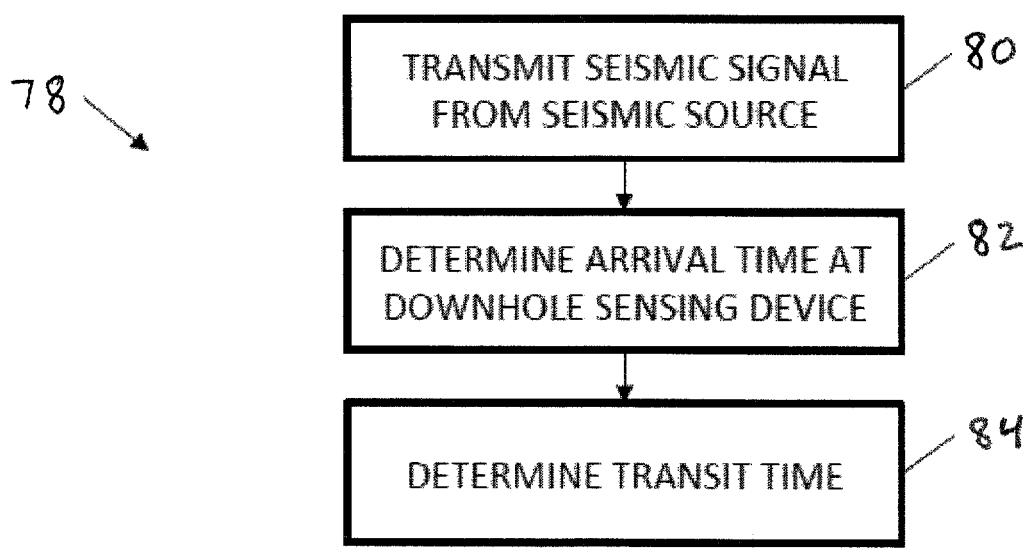
FIG. 5 depicts a flow diagram of a process for determining transit time of a seismic signal, according to one or more embodiments described.

FIG. 5 depicts a flow diagram of a process 78 for determining transit time of a seismic signal 66, according to one or more embodiments. The process 78 can include transmitting a seismic signal from a seismic source at a known time (process block 80), determining arrival time of the seismic signal at a seismic sensing device (process block 82), and determining transit time based at least in part on the known time and the arrival time (process block 84). In some examples, the process 78 can be implemented by executing instructions stored in a tangible, non-transitory, computer-readable medium, such as memory(s) 48/49, using one or more processors, such as processor(s) 46/47.

In some examples, a surface acquisition system 44 can know when the seismic source 64 is expected to transmit a synchronization seismic signal. Thus, the surface acquisition system 44 can determine a relative transit time based at least in part on the known time and the arrival time at a corresponding seismic sensing device 42. In particular, arrival time can be the transit time after the known transmission time (T0).

When beginning operation of the seismic system 62, the transit time determined based at least in part on transmission of an initial seismic signal 66 can be used as the reference transit time. To determine whether a synchronization variation can be expected to be present in the seismic system 62, the seismic source 64 can subsequently retransmit the synchronization seismic signal 66. In some examples, the seismic source 64 can periodically retransmit the synchronization seismic signal 66. In other examples, the seismic source 64 can retransmit the synchronization seismic signal 66 when a synchronization check can be desired.

Based at least on the subsequent transmission of the synchronization signal, the surface acquisition systems 44A/44B and/or the downhole tools 40A/40B can determine whether synchronization variations are expected to be present in the seismic system 62. For example, the surface acquisition system 44 and/or downhole tool 40 can determine that a synchronization variation can be expected to be present when a subsequent transit time varies from the reference transit time by more than a threshold. In some examples, the threshold can be dynamically adjusted, for example, to account for sensor error and/or to improve synchronization. When the difference is greater than the threshold, a surface acquisition system 44 and/or downhole tool 40 can indicate that a synchronization variation can be expected to be present, thereby enable corrective measures to be employed.

In some examples, the seismic source 64 and the seismic sensing device 42 can operate in a master-slave mode, in which the initial seismic signal 66 can trigger the start of recording by the seismic sensing device 42. In some examples, synchronization determination can be performed based on the assumption that the seismic source 64 remains in generally the same location. In other words, in some examples, the synchronization process can be reinitiated when the seismic source 64 moves location.

Figure 6:
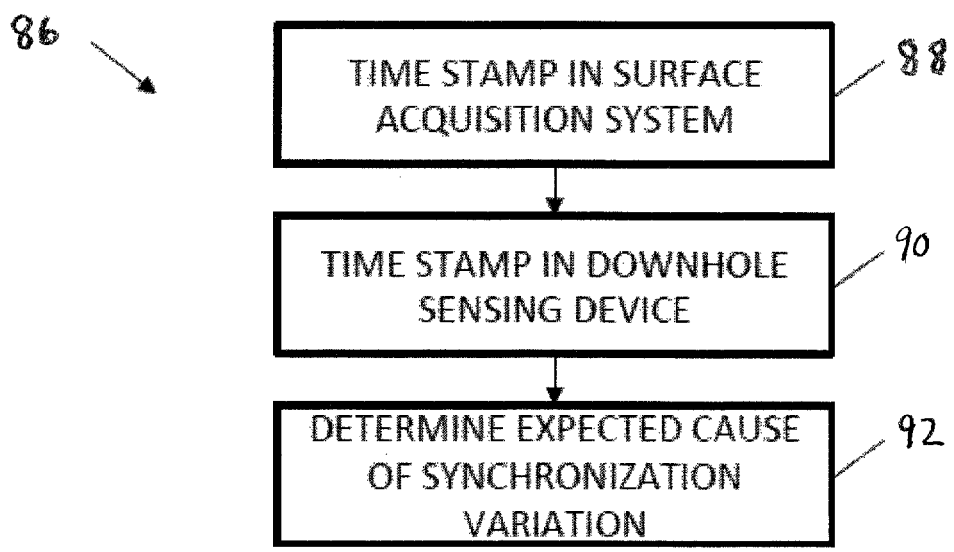
FIG. 6 depicts a flow diagram of a process for determining an expected cause of a synchronization variation, according to one or more embodiments described.

Moreover, in some examples, the seismic system 62 can facilitate determining one or more causes of a synchronization variation; for example, determining whether the synchronization variation is expected at the surface and/or downhole. FIG. 6 depicts a flow diagram of a process 86 for determining an expected cause of a synchronization variation, according to one or more embodiments. The process 86 can include time stamping in a surface acquisition system (process block 88), time stamping in a downhole sensing device (process block 90), and determining expected cause of a synchronization variation (process block 92). In some examples, the process 86 can be implemented by executing instructions stored in a tangible, non-transitory, computer-readable medium, such as memory(s) 48/49, using one or more processors, such as processor(s) 46/47.

In some examples, different surface acquisition systems 44 can utilize time-stamping techniques to determine an absolute transmission time of a synchronization signal, for example, based at least in part on an indication from the seismic source 64 and/or from an external (e.g., GPS or independent) source, not shown. In some examples, the delivery of a signal downhole with known timing (e.g. pulse at T0 or vibrator sweep) can be recorded by part of the downhole system using processor(s) 46/47 and memory(s) 48/49, (FIGS. 1 and 2) and time stamped as if it came from one of the seismic sensing devices 42A/42B. The signal can be derived from the seismic source 64 or the external source. In some examples, the signal can be an analog signal and can be delivered downhole by using a spare conductor in the logging cable 56 (FIG. 2).

In some examples, synchronization of downhole-to-surface signals can be performed to reduce a likelihood of transmission loss from the seismic sensing device 42 to the surface acquisition system 44. For example, when a downhole telemetry cartridge initially links up, the seismic sensing device 42 can load a job time counter (JTC) from the surface acquisition system 44. Subsequently, the seismic sensing device 42 can track and update the downhole telemetry cartridge timestamp to be in sync with JTC. In this manner, downhole timestamps can be synchronized with an absolute (e.g., GPS) timing. Verification can be accomplished with a time-tracking algorithm monitoring the timing information in surface and downhole telemetry components, which can facilitate identifying and correcting any synchronization variations within the downhole-to-surface telemetry (e.g., digital) path and surface-downhole time stamping within each independent recording system.

In some examples, the seismic (e.g., vibrator or pilot) signal can be acquired and time stamped to facilitate improving synchronization accuracy. For example, when the seismic source 64 can be a non-impulsive source (i.e. vibrator), correlation between multiple signals can be used to determine transit times. In some examples, when the seismic source 64 is weak, seismic sensing devices 42 are insensitive or in a noisy environment, the subsurface attenuation of signals is high, and/or the distance between the seismic source 64 and the seismic sensing device 42 is far, determination accuracy can be improved by activating the seismic source 64 multiple times, gathering the signal records from associated time periods, and stacking the records to build a signal-to-noise ratio prior to determining the Transit Times.

A seismic system comprises a seismic source configured to generate a first seismic signal and a second seismic signal in an adjacent formation; a first downhole sensing device disposed in a first borehole configured to detect the first seismic signal and the second seismic signal in the adjacent formation; and a first surface acquisition system communicatively coupled to the first downhole sensing device, where the first surface acquisition system can be configured to: determine a first reference transit time based on a known transmission time of a synchronization seismic signal and receipt of the synchronization signal by the first downhole sensing device; determine a first subsequent transit time based at least in part on detection of the second seismic signal by the first downhole sensing device; and determine whether a synchronization variation can be expected to be present based at least in part on the first reference transit time and the first subsequent transit time.

Various terms have been defined above. To the extent a term used in a claim is not defined above, it should be given the broadest definition persons in the pertinent art have given that term as reflected in at least one printed publication or issued patent. Furthermore, all patents, test procedures, and other documents cited in this application are fully incorporated by reference to the extent such disclosure is not inconsistent with this application and for all jurisdictions in which such incorporation is permitted.

While the foregoing is directed to embodiments of the present invention, other and further embodiments of the invention may be devised without departing from the basic scope thereof, and the scope thereof is determined by the claims that follow.

What is claimed is:

1. A seismic system, comprising:
   a seismic source configured to generate a first seismic signal and a second seismic signal in a formation adjacent the seismic source;
   a first downhole sensing device disposed in a first borehole configured to detect the first seismic signal and the second seismic signal in the formation; and
   a first surface acquisition system in communication with the first downhole sensing device, wherein the first surface acquisition system is configured to:
   determine a first reference transit time based at least in part on detection of the first seismic signal by the first downhole sensing device;
   determine a first subsequent transit time based at least in part on detection of the second seismic signal by the first downhole sensing device; and
   determine whether a synchronization variation is expected to be present based at least in part on the first reference transit time and the first subsequent transit time;
   wherein the seismic system is configured to determine whether an anticipated synchronization variation is occurring at the surface, downhole, or both, via one or more processors based on time-stamping the first and second seismic signals in the first surface acquisition system and in the first downhole sensing device.

2. The seismic system of claim 1, wherein the first surface acquisition system is further configured to define a threshold synchronization variation, and wherein the expectation of the presence of the synchronization variation is determined based at least in part on whether a difference between the first reference transit time and the first subsequent transit time is greater than the threshold synchronization variation.

3. The seismic system of claim 2, wherein the threshold synchronization variation is dynamically adjusted to account for sensor error.

4. The seismic system of claim 2, wherein the threshold synchronization variation is dynamically adjusted to improve synchronization relative to the threshold synchronization variation.

5. The seismic system of claim 1, wherein to determine whether an anticipated synchronization variation is occurring is further based on the first surface acquisition system time-stamping an absolute transmission time of the first reference transit time.

6. The seismic system of claim 1, further comprising:
   a second downhole sensing device disposed in a second borehole different from the first borehole, wherein the second downhole sensing device is configured to detect the first seismic signal and the second seismic signal in the formation; and
   a second surface acquisition system in communication with the second downhole sensing device, wherein the second surface acquisition system is configured to:
   determine a second reference transit time based at least in part on detection of the first seismic signal by the second downhole sensing device;
   determine a second subsequent transit time based at least in part on detection of the second seismic signal by the second downhole sensing device; and
   determine whether the synchronization variation is expected to be present based at least in part on the second reference transit time and the second subsequent transit time.

7. A method of performing a seismic operation, comprising:
   generating a first seismic signal and a second seismic signal in a formation adjacent a seismic source;
   detecting the first seismic signal and the second seismic signal in the formation with a first downhole sensing device, the first downhole sensing device in communication with a first surface acquisition system;
   determining a first reference transit time based at least in part on detection of the first seismic signal;
   determining a first subsequent transit time based at least in part on detection of the second seismic signal;
   determining whether a synchronization variation is expected to be present based at least in part on the first reference transit time and the first subsequent transit time; and
   determining whether an anticipated synchronization variation is occurring at the surface, downhole, or both, via one or more processors based on time-stamping the first and second seismic signals in the first surface acquisition system and in the first downhole sensing device.

8. The method of claim 7, further comprising defining a threshold synchronization variation, wherein the expectation of the presence of the synchronization variation is determined based at least in part on whether a difference between the first reference transit time and the first subsequent transit time is greater than the threshold synchronization variation.

9. The method of claim 8, wherein the threshold synchronization variation is dynamically adjusted to account for sensor error.

10. The method of claim 8, wherein the threshold synchronization variation is dynamically adjusted to improve synchronization relative to the threshold synchronization variation.

11. The method of claim 7, wherein determining whether an anticipated synchronization variation is occurring is further based on time-stamping an absolute transmission time of the first reference transit time.

* * * * *